(12) United States Patent
Budzynski

(10) Patent No.: US 6,891,312 B2
(45) Date of Patent: May 10, 2005

(54) MOTOR VEHICLE DOOR LOCK SYSTEM

(75) Inventor: Edgar Budzynski, Dortmund (DE)

(73) Assignee: Robert Bosch GmbH, Stuttgart (DE)

( * ) Notice: Subject to any disclaimer, the term of this patent is extended or adjusted under 35 U.S.C. 154(b) by 184 days.

(21) Appl. No.: 10/186,946

(22) Filed: Jul. 2, 2002

(65) Prior Publication Data

US 2003/0006649 A1 Jan. 9, 2003

(30) Foreign Application Priority Data

Jul. 4, 2001 (DE) .......................................... 101 31 896

(51) Int. Cl.[7] .............................................. B60R 25/10
(52) U.S. Cl. ..................... 310/324; 310/328; 310/330
(58) Field of Search ................................ 310/324, 328, 310/330, 331, 339; 307/10.1

(56) References Cited

U.S. PATENT DOCUMENTS 4,600,851 A * 7/1986 Isayama et al. ............. 310/324

| | | |
|---|---|---|
| 6,247,343 B1 | 6/2001 | Weiss et al. |
| 2002/0093418 A1 | 7/2002 | Schmitz et al. |
| 2003/0009855 A1 | 1/2003 | Budynski |

FOREIGN PATENT DOCUMENTS

| | | |
|---|---|---|
| DE | 199 57 087 A1 | 6/2001 |
| EP | 1 103 432 A1 | 5/2001 |
| WO | WO 99/28170 | 6/1999 |

* cited by examiner

Primary Examiner—Bao Vu
(74) Attorney, Agent, or Firm—Nixon Peabody LLP; David S. Safran

(57) ABSTRACT

A motor vehicle door locking system and a process for controlling the locking system. A piezoelement is assigned to a stationary outside door handle and is used to detect touching and/or actuation of the outside door handle. To increase the operating reliability, to simplify troubleshooting and to minimize the power consumption, there is a monitoring device that monitors the piezoelement. The piezoelement is monitored for fracture and the occurrence of the first signal.

31 Claims, 5 Drawing Sheets

MOTOR VEHICLE DOOR LOCK SYSTEM

BACKGROUND OF THE INVENTION

1. Field of the Invention

This invention relates to a motor vehicle door locking system having a piezoelement, and a process for controlling a motor vehicle door locking system.

2. Description of Related Art

European patent application EP 1 103 432 A1 discloses a motor vehicle door locking system in which a piezoelement is used as a sensor element, the piezoelement being installed in a substantially rigid outside door handle of the motor vehicle. The piezoelement is used to detect actuation of the outside door handle by an operator. In the disclosed motor vehicle door lock, there exists a disadvantage in that when the piezoelement fails, complex troubleshooting is required and the operating safety of the motor vehicle may also be compromised.

The international application WO 99/28170 discloses a motor vehicle door locking system in which pulling an outside door handle initiates the starting interval of data interrogation of a so-called "passive entry" function in order to ascertain whether the operator who is actuating the outside door handle is authorized for access. Pulling of the outside door handle can be detected, among others, by deformation of the piezoelement. Here, it is also disadvantageous if the piezoelement which is assigned to the outside door handle fails. This requires complex troubleshooting since failure would be assumed to be primarily in the "passive entry" function. It is furthermore disadvantageous if continuous evaluation or monitoring of the signals of the piezoelement is required in order to be able to start data interrogation directly after actuation of the outside door handle.

SUMMARY OF THE INVENTION

Therefore, a primary object of this invention is to provide a motor vehicle door locking system and a process for controlling the door locking system so that the operating reliability is increased and troubleshooting is simplified.

Another object of the invention is to provide a motor vehicle door locking system and process which minimizes the closed-circuit current demand.

The underlying premise of this invention is to monitor the piezoelement, on the one hand, for its operation, and on the other, for the occurrence of the first signal. This leads to several advantages as described.

In particular, there is a monitoring device that monitors the operation of the piezoelement, preferably a current path being formed by the piezoelement so that failure or fracture of the piezoelement leads to interruption of the current path to allow detection of the failure. This allows direct detection of a failure, especially a fracture, of the piezoelement. Accordingly, the operating reliability of the motor vehicle is increased, since a failure is immediately noticed and the pertinent piezoelement can be quickly replaced. Moreover, the monitoring of the current path in accordance with the invention greatly simplifies troubleshooting since when the motor vehicle door locking system fails, the failure can readily be established by monitoring whether the piezoelement assigned to the outside door handle is working properly.

According to one preferred development, the monitoring in accordance with the present invention can be additionally used to modify the evaluation of signals of the piezoelement depending on the operation of the piezoelement. For example, the gain of the amplifier assigned to the piezoelement can be increased if by monitoring, it is detected that the resistance of the piezoelement has changed, especially if the resistance is increased.

When monitoring for the occurrence of the first signal of the piezoelement, it can be considered that the evaluation of the signals of the piezoelement with respect to the detection of touching and/or actuation of the outside door handle is comparatively complex. This applies especially when pulling and pressing on the outside door handle which results in tensile loading and pressure loading, respectively, must be distinguished. In particular, in the evaluation, the absolute value, the relative value, the behavior, the rate of change and/or the time correlation or timing of the signals of the piezoelement should be considered in order to enable clear identification or detection of touching or actuation of the outside door handle. Accordingly, the evaluation requires a certain circuitry cost and/or computer cost. This dictates relatively high power demand of evaluation A signal is generally defined as the occurrence and/or change of electrical signals or characteristics of the piezoelement. The detection of the occurrence of the first signal of the piezoelement makes it possible to activate or start evaluation only, also called wakening, when the first signal of the piezoelement has occurred and has been detected by an activation device. This enables minimization of the closed-circuit current demand because an activation device or detection device which has a simple structure is optimized for a minimum closed-circuit current demand for detection of the occurrence of the first signal of the piezoelement and is continuously activated.

Furthermore, according to a first embodiment, it is provided that the starting interval of a "passive entry function" is initiated when the first signal of the piezoelement, or first touching or actuation of the outside door handle assigned to the piezoelement, has been detected. According to one embodiment, this detection can take place at the same time by the monitoring device for monitoring the operation of the piezoelement.

Furthermore, the details of distinguishing between the detection of touching and actuation of the outside door handle is not described in detail here. It depends ultimately on the evaluation whether touching of the outside door handle with, for example only very slight deformation or loading of the piezoelement on the one hand, and strong actuation on the other hand, can be distinguished, especially in order to control or trigger different functions accordingly. However, this need not be detailed here.

Other aspects, properties, features and advantages of this invention result from the following explanation of one preferred embodiment which is shown in the drawings.

DETAILED DESCRIPTION OF THE PREFERRED EMBODIMENT

Initially, it is noted that same reference numbers are used for the same or similar parts in the various drawings discussed in detail below. Therefore, corresponding or comparable advantages and properties arise for these same or similar parts, even if a repeated description is omitted in the discussion below.

Figure 1:
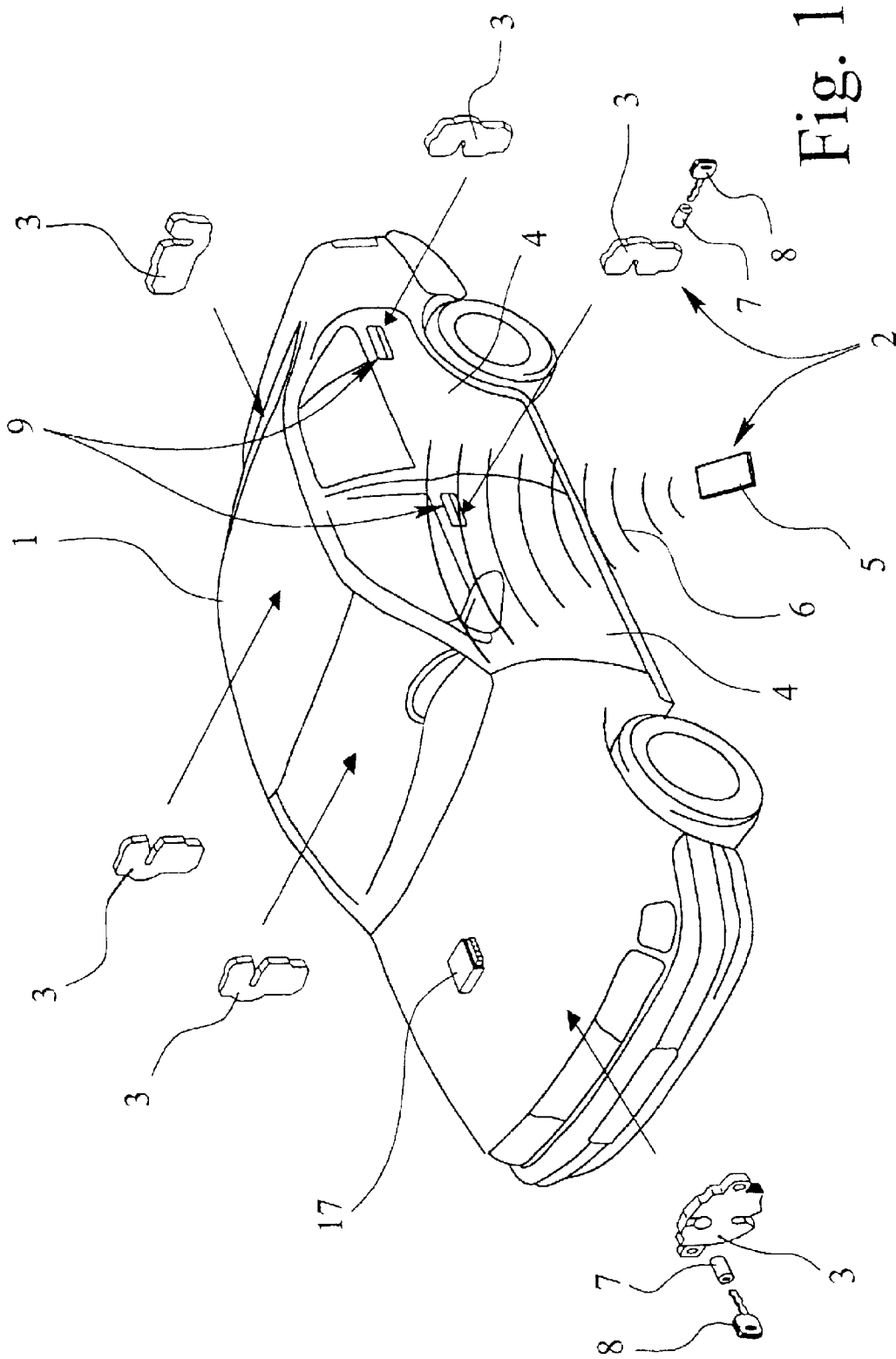
FIG. 1 shows a schematic perspective view of a motor vehicle with a motor vehicle door locking system in accordance with an embodiment of the present invention.

FIG. 1 schematically shows a motor vehicle 1 with a motor vehicle door locking system 2. The motor vehicle door locking system 2 has several vehicle door locks 3, especially for the vehicle doors 4, the rear hatch, the hood and the like, at the installation positions which are shown schematically in FIG. 1.

Preferably, each motor vehicle lock 3 can be locked and unlocked by a motor, such as an electric motor, by central interlock system or a central interlock drive known in the art. In the embodiment where an electric lock is provided in the motor vehicle locks 3 of the vehicle side doors 4, each motor vehicle lock 3 has the added possibility of motorized opening. Therefore, lifting of the detent pawl (not shown) may be attained by an opening drive (not shown). Locking and unlocking can also be accomplished accordingly using only the circuitry of the central interlock system or a central interlock drive.

The motor vehicle door locking system 2 is preferably equipped with a "passive entry" function. Here, a "passive entry" function is defined as an automatic, vehicle-side data interrogation or identification of an operator-side data medium such as a transponder 5 or the like, as indicated by signal waves 6, in order to ascertain whether an operator approaching the motor vehicle 1 or an operator about to open the vehicle 1 or the vehicle door 4 is authorized for access. This is generally checked by the corresponding electronics of the motor vehicle 1. With the corresponding authorization of the operator, ordinarily automatic unlocking takes place either of a central interlock system, of the door lock 3 of the driver-side door 4, or at least of the lock 3 of the door 4 upon being approached by the operator or upon the outside door handle being touched or activated by the operator. The energy or power demand of the "passive entry" function or data interrogation is considerable. Therefore, the corresponding electronics is only turned on or activated when necessary. Since a certain time is required for turning on or activating the electronics and data interrogation, this takes place as quickly as possible after detection of the approach of an authorized individual and/or only after initial touching and/or actuation of the outside door handle. Turning on or activating the electronics for data interrogation is referred to as starting of the authorization interrogation below.

If necessary, one locking cylinder 7 for actuation with a mechanical key 8 is assigned to the motor vehicle lock 3 of the driver's door and the hood lock. Thus, the motor vehicle door lock 3 of the driver's door can be mechanically actuated or unlocked in an emergency with the key 8 and thereby opened. There can be the corresponding emergency unlocking or emergency opening for the locks 3 of the other doors 4 as well.

Figure 2:
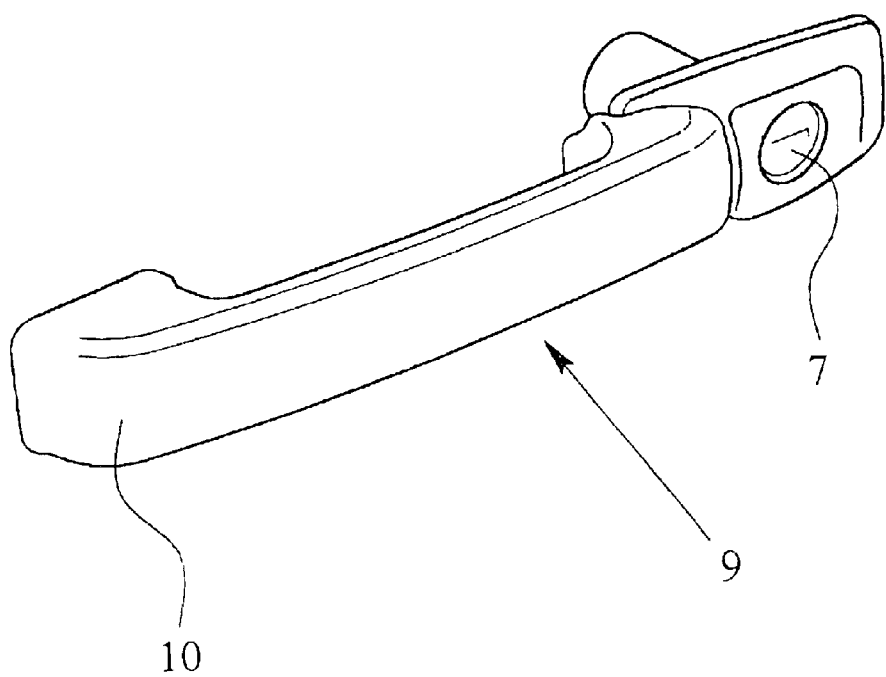
FIG. 2 shows an outside door handle arrangement of the motor vehicle door locking system shown in FIG. 1.

One outside door handle arrangement 9 is assigned to at least each motor vehicle door lock 3 of the motor vehicle side doors 4, as shown in FIG. 1. FIG. 2 shows the outside door handle arrangement 9 of the driver's door with an integrated locking cylinder 7. However, the lock cylinder can also be omitted. The outside door handle arrangement 9 also has an outside door handle 10 which is made stationary and which has no moving parts, such as a movable actuating and opening lever or the like. A bow-shaped handle is shown, however, a flap-shaped handle could likewise be used as a possible alternative.

Figure 3:
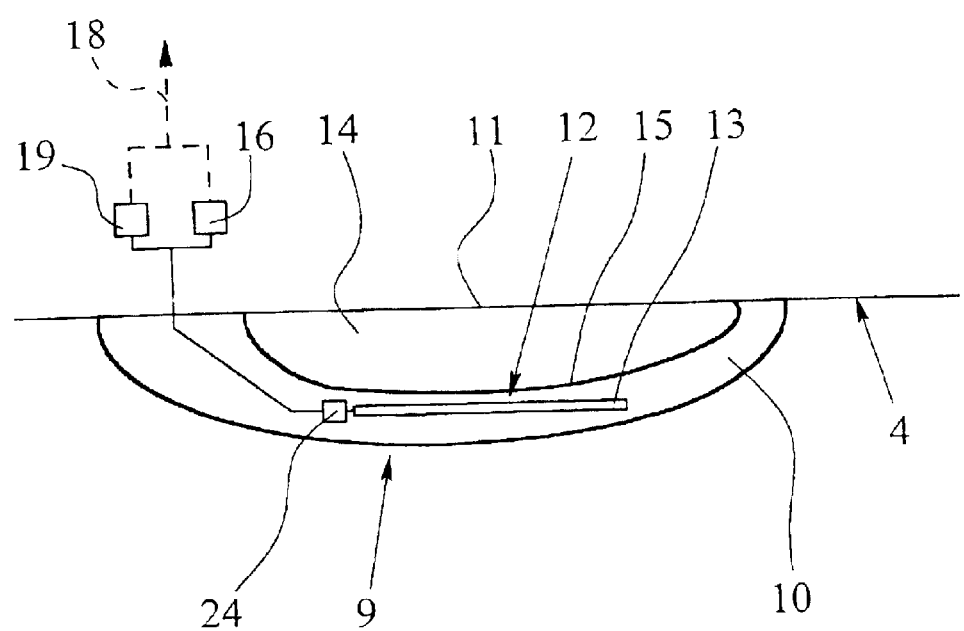
FIG. 3 shows a schematic cross section of the outside door handle arrangement.

The outside door handle arrangement 9 can moreover comprise an adjacent door area, as is shown in FIG. 3. In such an embodiment, the outside door handle arrangement 9 together with this adjacent door area 11 is inserted as a unit into the assigned motor vehicle door 4. However, this is not absolutely necessary for the stationary outside door handle 10. FIG. 3 shows an outside door handle arrangement 9 without the locking cylinder 7. A sensor 12 is assigned to the outside door handle 10. It has a deformation-sensitive, force-sensitive or pressure-sensitive sensor element in the form of a piezoelement 13.

The piezoelement 13 is especially a piezocrystal which upon loading or deformation, produces an electrical voltage by crystal deformation, especially on its sides perpendicular to the direction of deformation. This voltage is tapped, preferably with high-resistance, amplified, and evaluated. However, the piezocrystal can also carry out resistive evaluation and/or optionally, capacitive evaluation of signals or of the characteristics of the piezoelement 13 for detection of loading or deformation of the piezoelement 13.

The outside door handle 10 bounds or defines an "engagement space" 14 for the hand of the operator (not shown). The engagement space 14 is defined as the space in which the hand of an operator preferably fits to actuate the outside door handle 10.

The piezoelement 13 can be located on the inside wall or the inner side 15 of the outside door handle 10 facing the engagement space 14, and in particular, covers the inside 15 and/or the adjoining areas of the outside door handle 10 over a large area, preferably essentially completely. The piezoelement 13 can however, be integrated into the outside door handle 10, especially located within or potted in a cavity.

The outside door handle 10 is preferably, at least in areas, made elastically deformable. The sensor 12 can detect deformation or loading of the outside door handle 10 caused by actuation, so that touching or actuation of the outside door handle 10 can be detected.

Evaluation electronics or evaluation device 16 is assigned to the piezoelement 13. The evaluation device 16 is preferably at least partially, integrated into the outside door handle arrangement 9 or the outside door handle 10 itself, but it can also be housed, for example, in the assigned motor vehicle door 4.

In addition or alternatively, evaluation can take place partially in a door control device which is assigned to the motor vehicle door 4 and/or central motor vehicle electronics or control electronics 17 of the motor vehicle 1 which is shown in FIG. 1.

When the hand of an operator (not shown) touches and actuates the outside door handle 10, this leads to an electrical signal or a change in electrical signals and/or characteristics of the sensor 12 or the piezoelement 13 which can be evaluated as touching or actuation of the outside door handle 10 by the evaluation device 16.

In the schematic FIG. 3, the broken arrow 18 indicates that the evaluation device 16 can output the corresponding evaluation signals, the evaluation device 16 being connected to the central control electronics 17, for example via a CAN bus, and/or to a door control device (not shown), for example, via a LIN bus. Of course, other connection versions are also possible here.

One important aspect of the present invention is that the motor vehicle door locking system 2, in addition to the evaluation device 16, has a monitoring device 19 which is assigned to the piezoelement 13, as indicated in FIG. 3. It should be noted that whereas in the illustrated embodiment described herein, specific devices are shown for the evaluation device 16 and the monitoring device 19, other embodiments may be provided with a single device that performs these functions. In yet other embodiments, these functions may be integrated in a device which performs other functions as well. The monitoring device 19 is used to monitor the piezoelement 13 for operation, in the example of the figure, such as for fracture.

A simple preferred example embodiment of the monitoring device 19 is detailed below using FIG. 4. In the example embodiment of FIG. 4, the basic function of the monitoring device 19 is to form a current path 20 which runs through the piezoelement 13 and to monitor the current. Preferably, the current path 20 through the piezoelement 13 is formed by a corresponding conductor arrangement of the piezoelement 13. In particular, the conductive metal-coated surface of the piezoelement 13, for example, is suited for this purpose. For example, the metal-coated outside surface of a ceramic body of the piezoelement 13 makes contact on opposite end areas. Regardless of this conductive through connection, the signals caused by deformation or loading of the piezoelement 13 can be detected on the piezoelement 13, as already explained.

The monitoring device 19 has a power source 21 and an electrical resistor 22 which are series-connected to the piezoelement 13 in the embodiment shown. If a power supply voltage $U_V$ is applied to the current path 20 which has been formed in this manner, an at least essentially constant current flows through the piezoelement 13 and the resistor 22. The voltage drop $U_R$ on the resistor 22 is monitored. In particular, this is attained, for example, through an amplifier or a comparator 23, as indicated in FIG. 4. For example, the comparator 23 compares the voltage drop $U_R$ to a reference voltage. If the voltage drop $U_R$ falls below the reference voltage or the voltage drop $U_R$ is completely absent, a warning signal is outputted. This warning signal indicates that the resistance of the piezoelement 13 has become too high or that the current path 20 has been completely interrupted, for example, as a result of fracture of the piezoelement 13.

The warning signal can be outputted, for example, to the evaluation device 16 and/or the control electronics 17. Alternatively or additionally, the warning signal can be displayed, for example, to warn the user of the motor vehicle 1, to indicate a failure of the piezoelement 13, and/or facilitate troubleshooting during a repair.

In the example shown, a preamplifier 13 or a first amplifier 24 (shown in FIG. 5) is assigned to the piezoelement 13, as is shown schematically in FIG. 3. In reference to FIG. 5, the first amplifier 24 is located especially directly adjacent to the piezoelement 13 and preferably forms an installation unit with the piezoelement. In particular, the first amplifier 24 and optionally, other electronics can be located directly on the piezoelement 13 and carried by it. For instance, the first amplifier 24 can also be regarded as part of the sensor 12.

As already indicated above, functional properties are important here instead of the particular structure and devices described. Thus, it is less important whether the evaluation device 16, the monitoring device 19, and the first amplifier 24 are formed by separate circuits, or either fully or in part, by common circuits, integrated circuits or also common boards, conductor arrangements or the like. Optionally, these functional units can also form one or more installation units, together with the sensor 12.

Functional aspects are detailed below using the block diagram shown in FIG. 5 which illustrates one embodiment of the motor vehicle door locking system 2. In this embodiment, the sensor 12 with its piezoelement 13 is connected to the evaluation device 16. According to a first embodiment, the sensor 12 comprises the first amplifier 24, therefore the first amplifier stage. The amplifier 24 is used to detect or recognize the first signal of the piezoelement 13, as already explained above, in order to then awaken or turn on the remaining electronics, and to be able to start the evaluation and/or authorization interrogation, for example. The first amplifier 24 is connected to the battery or electrical system 25 of the motor vehicle 1, either directly, or via a power supply device 26 to ensure continuous supply of power.

Preferably, the first amplifier 24 or other suitable circuit is made such that the power consumption is minimal. For example, the circuit or the amplifier 24 is made with MOSFET technology and/or has a closed-circuit current of less than 100 $\mu A$.

When the piezoelement 13, as a result of initial touching or actuation of the outside door handle 10, is deformed or loaded, this is detected by the amplifier 24 and a corresponding signal, hereinafter called the "awakening signal A", is output to the activation or awakening circuit 27. The awakening signal A can, if necessary, also be outputted directly to the central control electronics 17 of FIG. 1, or other motor vehicle electronics in order to, for example, start the authorization interrogation for the passive entry function.

The awakening circuit 27 can be made or defined as a holding circuit which temporarily activates or turns on the evaluation device 16 and/or the monitoring device 19, specifically in the awakened or turned-on state after receiving the awakening signal A. In the example shown, the awakening circuit 27 forms a temporary power supply for the evaluation device 16 and the monitoring device 19. Therefore, the awakening circuit 27 supplies the two devices 16 and 19 after receiving the awakening signal A with power, at least temporarily.

Figure 5:
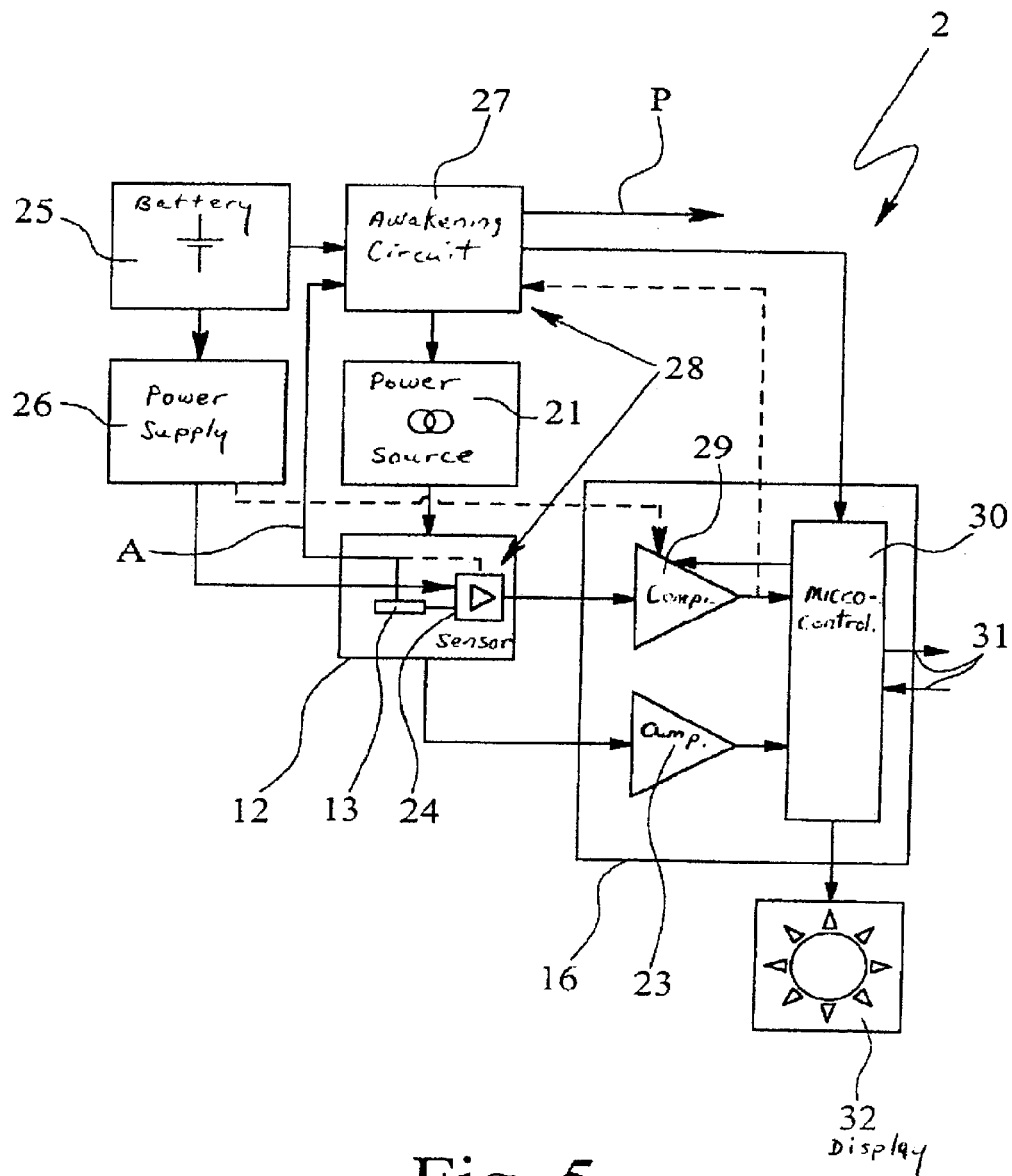
FIG. 5 shows a schematic block diagram of the motor vehicle door locking system in accordance with an embodiment of the present invention.

In addition, the awakening circuit 27, after receiving the awakening signal A, can output a corresponding signal to the control electronics 17 and/or to other electronics of the motor vehicle 1, for example, to start or activate the authorization interrogation of the "passive entry" function and/or other motor vehicle functions, as indicated by arrow P in FIG. 5.

Another important aspect of this invention is that the motor vehicle door locking system 2 has an activation device 28. This activation device 28 is formed by the first amplifier 24 and the awakening circuit 27 in the above described example shown. But this represents only one embodiment. In terms of circuit engineering, the activation device 28 can also be made differently. Furthermore, the activation device 28 can also be integrated into the evaluation device 16 and/or the monitoring device 19 or other components of the motor vehicle door locking system 2.

One important aspect is that the activation device 28 permanently or continuously monitors the piezoelement 13 for the occurrence of a first signal and thus, for the first contact or actuation of the outside door handle 10. Only after the occurrence of this first signal is the evaluation device 16, activated or turned on. This takes place here by the power supply of the evaluation device 16 being turned on only after the occurrence of the first signal.

In the example shown, the corresponding applies here to the monitoring device 19, i.e., the monitoring device 19 is turned on or activated only after detection or occurrence of the first signal of the piezoelement 13 by the activation device 28. Alternatively, the monitoring device 19 can be operated permanently or continuously. This alternative embodiment makes sense especially when the monitoring device 19 and the activation device 28 are integrated into one circuit.

The evaluation device 16 in the embodiment shown in FIG. 5 has its own amplifier stage such as second amplifier 29, and a microcontroller 30 or other suitable evaluation circuit. As already explained, the monitoring device 19 can be integrated into the evaluation device 16. Here, the evaluation device 16 and/or the activation device 28 comprises, for example, the comparator 23 of the monitoring device 19 which is not shown individually in FIG. 5.

Figure 4:
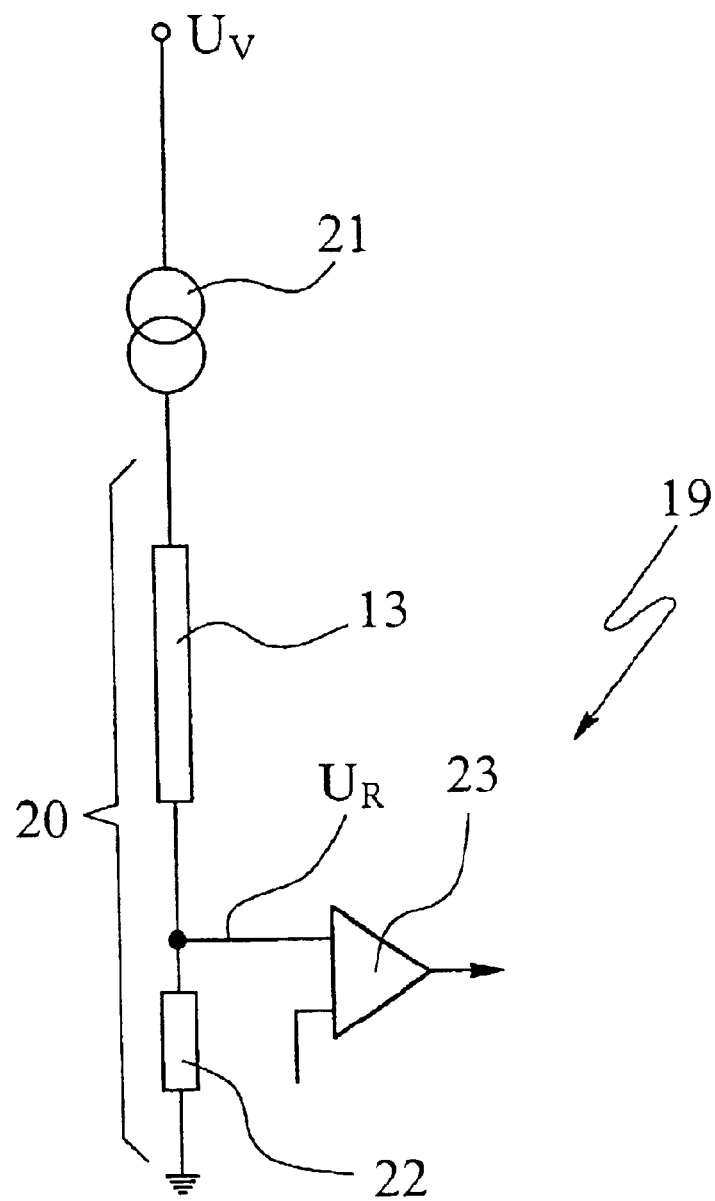
FIG. 4 shows a schematic of a piezoelement with an assigned monitoring device.

One possible mode of operation and one preferred structure of the monitoring device 19 have already been explained using FIG. 4. As for other components of the monitoring device 19, FIG. 5 shows the power source 21 which is connected to the awakening circuit 27 and accordingly supplies power to the piezoelement 13 and the current path 20 shown in FIG. 4, only if beforehand, the first signal of the piezoelement 13 has been detected, i.e., when the awakening circuit 27 is in the awakened or on-state. Processing of the initial signal of the monitoring device 19 made available by the comparator 23 takes place in the example shown, by the evaluation device 16 and in particular, by its microcontroller 30 or other suitable circuit.

Before detailing possible signal evaluation, an alternative embodiment is briefly explained. In such an example, the first amplifier 24 which is preferably directly assigned to the piezoelement 13 can be omitted. The amplifier 29 then assumes the functions of the first amplifier 24. The amplifier 29 is then connected accordingly to a power supply, such as the power supply device 26, as shown by the broken arrow. When the first signal of the piezoelement 13 is detected, the amplifier 29 furthermore makes available the required awakening signal A for the awakening circuit 27 as indicated by the broken arrow connection to the awakening circuit 27.

In this second embodiment, of course, minimization of the power consumption is desired. Accordingly then, the amplifier 29 is made very economical in terms of power, and therefore has a low closed-circuit current of preferably less than 100 $\mu$A. Thus, the electrical system 25 of the vehicle 1 is not overloaded even when the motor vehicle 1 is stationary for a longer time.

When the evaluation device 16 is activated, therefore turned on, evaluation of the sensor signals takes place continuously, i.e., here the signals of the piezoelement 13 are amplified by the amplifier 29 and optionally by the amplifier 24. Evaluation thereupon checks the signals for whether there is actuation of the outside door handle 10, especially whether the motor vehicle door lock 3 which is assigned to the outside door handle 10 is to be opened or closed. Preferably, it is distinguished between pulling and pressing on the outside door handle 10, especially in order to cause selectively opening or closing of the motor vehicle door lock 3 for an electric lock. Alternatively or in addition, signal evaluation can also be used to lock and unlock the assigned motor vehicle door lock 3 and/or the central interlock system of the motor vehicle 1.

In the embodiment shown, preferably locking and unlocking takes place largely independent of actuation of the outside door handle 10 via the aforementioned "passive entry" function of the motor vehicle door locking system 2. The "passive entry" function, however, can also be used only to check access authorization. Locking and unlocking as well as subsequent opening and closing then take place depending on the detected touching and/or actuation of the outside door handle 10.

In the evaluation of the sensor signals, the absolute values, the relative values, the signal behavior, the rate of change and/or the time correlation of the sensor signals are considered or evaluated. For example, threshold value evaluation makes it possible to distinguished between initial touching or slight actuation, and stronger actuation for opening the motor vehicle door 4. Moreover, it is also possible to distinguish between a tensile and pressure load, therefore, between pulling and pressing on the outside door handle 10.

For example, it is possible for initial slight pressing and/or pulling on the outside door handle 10 to be necessary in order to start the aforementioned authorization interrogation of the "passive entry" function. In this case, the corresponding signal could be outputted to the passive entry function or control electronics 17, or other electronics of the motor vehicle 1 by the monitoring device 16 or its microcontroller 30 after corresponding evaluation. Only after pressing or especially pulling a second time on the outside door handle 10 does unlocking and/or opening of the assigned motor vehicle door lock 3 take place.

Alternatively, pressing or pulling once with slowly increasing force on the outside door handle 10 can be enough to start or carry out the authorization interrogation on the one hand and/or to cause unlocking of the assigned motor vehicle door lock 3, and on the other hand, to then unlock and/or open the motor vehicle door lock 3. This continuous touching and actuation of the outside door handle 10 corresponds more to the conventional handling and is therefore, preferred.

The evaluation device 16 outputs the corresponding control signals so that depending on the control signal, the assigned motor vehicle door lock 3 is locked, unlocked, opened, and/or closed. Communications of the monitoring device 16 and its microcontroller 30 is shown schematically in FIG. 5 by arrows 31. In particular, the evaluation device 16 communicates with a central interlock system which is not detailed, the central control electronics 17 and/or other electronics of the motor vehicle 1 such as a door control device or the like (not shown) located in the assigned motor vehicle door 4, through a bus system, individual cables, or other data or control network.

If the motor vehicle door locking system 2 has a "passive entry" function as in the embodiment shown, the authorization interrogation starts as early as possible. In particular, starting of the authorization interrogation can be induced on the one hand, by the awakening circuit 27, or on the other hand by the evaluation device 16.

In the embodiment shown, the evaluation device 16 moreover evaluates the monitoring signals made available by the monitoring device 19 or its comparator 23. For example, the microcontroller 23 outputs a warning signal when the voltage drop $U_R$ drops below a certain reference value, which may be due to interruption of the current path 20, for instance. In this case, the evaluation device 16 outputs a failure signal which can be displayed with the display device 32 for the vehicle user as shown in FIG. 5. The failure signal can, if necessary, also be further processed only internally in the motor vehicle electronics and, for example, displayed only for repair or service/maintenance purposes.

According to one embodiment, when the warning signal fails, the gain of the amplifier 24 and/or 29 changes, and is set up to enable emergency activation or emergency opening. In particular, when a warning signal occurs, the conventional evaluation can also be modified, for example, a threshold value which must be exceeded to cause opening by the sensor signals can be reduced. Therefore failure or emergency evaluation can take place instead of normal evaluation of the sensor signals, to the extent they can still occur or be detected.

In the embodiment shown, there is preferably continuous monitoring of the piezoelement 13. If necessary, the monitoring however can also take place only temporarily or cyclically in certain intervals.

To turn off or reset the activation device 28 or the awakening circuit 27, an internal timer may be provided, for example. The power supply to the evaluation device 16 and the monitoring device 19 or its power source 21 is turned off after a predetermined time, the time being optionally adjustable. Alternatively or in addition, turning off the power supply can also take place, for example, on the corresponding sleep signal of the control electronics 17 or other electronics of the motor vehicle 1 and/or on a locking command of the remote control or the like.

The evaluation device 16, the monitoring device 19, the activation device 28 and the other components of the motor vehicle door locking system 2, depending on the requirement and space conditions, can be installed in the outside door handle 10, the outside door handle arrangement 9, and/or the assigned motor vehicle door 4. For example, individual components or functions can be integrated into a door control device (not shown), the control electronics 17, or other electronics of the motor vehicle 1. In addition, it should be pointed out that the individual aforementioned functions can be implemented by the corresponding software in existing electronic components.

Moreover, in yet other embodiments of the present invention, instead of the piezoelement 13 or the piezocrystal, another sensor element can also be used accordingly. Preferably, the alternative sensor used is likewise a sensor element which converts a mechanical quantity, especially load or deformation, directly into an electrical signal in the initially mentioned sense.

While various embodiments in accordance with the present invention have been shown and described, it is understood that the invention is not limited thereto. The present invention may be changed, modified and further applied by those skilled in the art. Therefore, this invention is not limited to the detail shown and described previously, but also includes all such changes and modifications.

I claim:

1. Motor vehicle door locking system comprising:
  a motor vehicle door lock;
  an outside door handle assigned to the motor vehicle door lock;
  a piezoelement assigned to the outside door handle;
  an evaluation device connected to the piezoelement for detecting actuation of the outside door handle; and
  a monitoring device for monitoring the piezoelement with respect to at least one of its continued operability and occurrence of a first signal from the piezoelement.

2. Motor vehicle door locking system of claim 1, wherein the piezoelement is monitored for fracture by the monitoring device.

3. Motor vehicle door locking system of claim 1, wherein the monitoring device monitors an electrical characteristic of the piezoelement.

4. Motor vehicle door locking system of claim 3, wherein the electrical characteristic monitored is at least one of an electrical current path and an electrical signal of the piezoelement.

5. Motor vehicle door locking system of claim 1, wherein the monitoring device includes has a power source, a resistor, and a comparator, the piezoelement and the resistor being connected in series to the power source, and the voltage drop across the resistor is evaluated by the comparator.

6. Motor vehicle door locking system of claim 1, wherein the monitoring device monitors operation of the piezoelement, and outputs a service signal.

7. Motor vehicle, door locking system of claim 1, further comprising an activation device adapted to activate at least one of the monitoring device and the evaluation device; and wherein at least one of the monitoring device and the evaluation device is turned on by the activation device only if the first signal from the piezoelement has been previously detected.

8. Motor vehicle door locking system of claim 1, further comprising an activation device adapted to activate at least one of the monitoring device and the evaluation device; and wherein the motor vehicle door locking system is operable with a passive entry function, whereby authorization interrogation is initiated by at least one of the activation device and the evaluation device when the first signal from the piezoelement has been detected.

9. Motor vehicle door locking system of claim 1, further comprising an amplifier assigned to the piezoelement.

10. Motor vehicle door locking system of claim 9, wherein the amplifier is a component of the activation device.

11. Motor vehicle door locking, system of claim 9, wherein the amplifier is adapted to detect the first signal from the piezoelement.

12. Motor vehicle door locking system of claim 9, wherein the amplifier assigned to the piezoelement forms an installation unit with the piezoelement.

13. Motor vehicle door locking system of claim 9, wherein the amplifier is located adjacent to the piezoelement.

14. Motor vehicle door locking system of claim 9, wherein the evaluation device is connected to the amplifier assigned to the piezoelement.

15. Motor vehicle door locking system of claim 1, wherein the evaluation device includes amplifier.

16. Motor vehicle door locking system of claim 15, wherein gain of the amplifier in the evaluation device is adjustable based on detected operation of the piezoelement.

17. Motor vehicle door locking system of claim 9, wherein gain of the amplifier assigned to the piezoelement is adjustable based on detected operation of the piezoelement.

18. Motor vehicle door locking system of claim 17, wherein the amplifier assigned to the piezoelement operates at a closed-circuit current of less than 100 $\mu$A.

19. Motor vehicle door locking system of claim 9, further including a power supply that provides continuous power to at least one of the activation device and the amplifier.

20. Motor vehicle door locking system of claim 1, further comprising an activation device adapted to activate at least one of the monitoring device and the evaluation device; and wherein the activation device activates the evaluation device after detection of the first signal from the piezoelement to allow further evaluation of the first signal and any subsequent signals from the piezoelement.

21. Motor vehicle door locking system of claim 1, further comprising an activation device adapted to activate at least one of the monitoring device and the evaluation device; and wherein the activation device operates at low closed-circuit current of less than 100 μA.

22. Motor vehicle door locking system of claim 1, further comprising an activation device adapted to activate at least one of the monitoring device and the evaluation device; and wherein the activation device includes at least one of a holding circuit and an awakening circuit that is adapted to supply temporary power to at least one of the monitoring device and the evaluation device.

23. Motor vehicle door locking system of claim 1, further comprising an activation device adapted to activate at least one of the monitoring device and the evaluation device.

24. Motor vehicle door locking system comprising
a motor vehicle door lock;
an outside door handle assigned to the motor vehicle door lock;
a piezoelement assigned to the outside door handle;
an evaluation means connected to the piezoelement for detecting actuation of the outside door handle; and
a monitoring means for monitoring the piezoelement with respect to at least one of its continued operability and occurrence of a first signal from the piezoelement.

25. Motor vehicle door locking system of claim 24, further comprising an activation means for activating at least one of the monitoring device and the evaluation means.

26. Method for controlling a motor vehicle door locking system comprising the steps of:
monitoring a signal from a piezoelement assigned to an outside door handle;
sensing occurrence of a first signal from the piezoelement; and
evaluating the first signal and any subsequent signals from the piezoelement after the occurrence of the first signal to detect actuation of the outside door handle.

27. Method of claim 26, further including the step of monitoring the piezoelement for operation.

28. Method of claim 26, wherein the piezoelement is monitored by monitoring a current path that runs through the piezoelement.

29. The method of claim 27, further including the step of continuously supplying the piezoelement with a constant current, and monitoring a voltage drop across a series-connected resistor to monitor operation of the piezoelement.

30. Method of claim 27, further including the step of modifying the evaluation of the first signal and any subsequent signals based on the operation of the piezoelement.

31. Method of claim 27, further including the step of terminating evaluation of the first signal and any subsequent signals from the piezoelement after a predetermined time.

* * * * *